(12) United States Patent
Tsai et al.

(10) Patent No.: US 12,523,937 B2
(45) Date of Patent: Jan. 13, 2026

(54) PROTECTIVE RING STRUCTURE FOR VACUUM INTERFACE AND METHOD OF USING THE SAME

(71) Applicant: TAIWAN SEMICONDUCTOR MANUFACTURING COMPANY, LTD., Hsinchu (TW)

(72) Inventors: Ming-Hsun Tsai, Hsinchu (TW); Yu-Fa Lo, Kaohsiung (TW); Shang-Chieh Chien, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 93 days.

(21) Appl. No.: 17/345,242

(22) Filed: Jun. 11, 2021

(65) Prior Publication Data
US 2022/0100101 A1 Mar. 31, 2022

Related U.S. Application Data

(60) Provisional application No. 63/084,283, filed on Sep. 28, 2020.

(51) Int. Cl.
*G03F 7/00* (2006.01)

(52) U.S. Cl.
CPC ...... *G03F 7/70033* (2013.01); *G03F 7/70841* (2013.01); *G03F 7/7085* (2013.01); *G03F 7/70975* (2013.01)

(58) Field of Classification Search
CPC .......... G03F 7/70033; G03F 7/70841; G03F 7/7085; G03F 7/70975; G03F 7/70925; G03F 7/70983; G03F 7/70; G03F 7/708; G03F 7/70808; G03F 7/70858–70891; G03F 7/70908; G03F 7/70916; G03F 7/7095; G03F 7/70991; F16L 55/18; H05G 2/00–008; G02B 6/4219; G02B 6/422;

(Continued)

(56) References Cited

U.S. PATENT DOCUMENTS

| | | | | | |
|---|---|---|---|---|---|
| 4,094,492 | A | * | 6/1978 | Beeman | F16K 3/03 138/45 |
| 6,325,390 | B1 | * | 12/2001 | Sillmon | F16L 23/22 285/379 |

(Continued)

FOREIGN PATENT DOCUMENTS

| CN | 104981438 | 10/2015 |
|---|---|---|
| CN | 108681212 A | 10/2018 |

(Continued)

OTHER PUBLICATIONS

English translation of KR20160049142, published May 9, 2016. (Year: 2016).*

*Primary Examiner* — Christina A Riddle
(74) *Attorney, Agent, or Firm* — NZ Carr Law Office

(57) ABSTRACT

An assembly for use with an extreme ultraviolet (EUV) chamber, along with methods of using such, are described. The assembly includes a ring structure. The ring structure includes an outer ring and an inner ring disposed radially inward of the outer ring. The assembly also includes a vacuum interface to be attached and in contact with the inner ring, wherein the inner ring has an opening that is size adjustable to allow a device to pass through and into the vacuum interface.

13 Claims, 11 Drawing Sheets

(58) Field of Classification Search
CPC .. G02B 6/4226; G02B 6/4233; G02B 6/4234;
G02B 6/4236; G02B 6/4248; G02B
6/4249; G02B 6/425; G02B 6/4256;
G02B 6/4257; G02B 6/426; G02B
6/4261; G02B 6/4292; G02B 6/4296;
G02B 7/026; G03B 6/4471; G03B
6/3628; G03B 6/3644
USPC ..... 355/30, 52–55, 67–77; 250/492.1, 492.2,
250/492.22, 493.1, 504 R
See application file for complete search history.

(56) References Cited

U.S. PATENT DOCUMENTS

| | | | |
|---|---|---|---|
| 8,785,895 B2 | 7/2014 | Umeda et al. | |
| 10,718,718 B2 | 7/2020 | Chang et al. | |
| 2005/0234537 A1* | 10/2005 | Edin | B25B 27/10 |
| | | | 623/1.11 |
| 2009/0208280 A1* | 8/2009 | Van De Putte | C23C 14/3407 |
| | | | 403/341 |
| 2010/0270480 A1* | 10/2010 | Echner | A61N 5/1042 |
| | | | 250/492.1 |
| 2012/0104290 A1* | 5/2012 | Nishisaka | H05G 2/006 |
| | | | 315/111.21 |
| 2013/0134330 A1* | 5/2013 | Fujimoto | H05G 2/008 |
| | | | 359/811 |
| 2014/0008552 A1* | 1/2014 | Umeda | H05G 2/006 |
| | | | 250/504 R |
| 2015/0321944 A1* | 11/2015 | Yamazaki | C03B 37/027 |
| | | | 277/312 |
| 2017/0045832 A1* | 2/2017 | Molkenboer | G03F 7/70983 |
| 2017/0131129 A1* | 5/2017 | Ahr | H05G 2/006 |
| 2018/0341077 A1* | 11/2018 | Watanabe | G03F 7/70991 |

FOREIGN PATENT DOCUMENTS

| | | | | |
|---|---|---|---|---|
| CN | 108984822 A | | 12/2018 | |
| CN | 110837204 A | | 2/2020 | |
| CN | 110874009 A | | 3/2020 | |
| EP | 1870687 A1 | | 12/2007 | |
| JP | 2012109218 | | 6/2012 | |
| JP | 2016129083 A | | 7/2016 | |
| KR | 20160049142 | * | 5/2016 | |
| TW | 202022493 | | 6/2020 | |
| WO | 2020020759 A1 | | 1/2020 | |
| WO | WO-2021044037 A1 | * | 3/2021 | ............. H05G 2/006 |

* cited by examiner

PROTECTIVE RING STRUCTURE FOR VACUUM INTERFACE AND METHOD OF USING THE SAME

BACKGROUND

Semiconductor lithography processes may use lithographic templates (e.g., photomasks or reticles) to optically transfer patterns onto a substrate. Such a process may be accomplished, for example, by projection of a radiation source, through an intervening photomask or reticle, onto the substrate having a photosensitive material (e.g., photoresist) coating. The minimum feature size that may be patterned by way of such a lithography process is limited by the wavelength of the projected radiation source. In view of this, extreme ultraviolet (EUV) radiation sources and lithographic processes have been introduced. EUV systems, which utilize reflective rather than conventional refractive optics, are very sensitive to contamination issues. Particularly, particle contamination introduced onto surfaces of an EUV chamber (e.g., within which EUV light is generated) can result in degradation of various components of the EUV chamber. As such, it is necessary to periodically inspect and perform preventive maintenance on the EUV chamber. However, existing EUV chamber inspection techniques have not proved entirely satisfactory in all respects and a solution is needed in the industry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
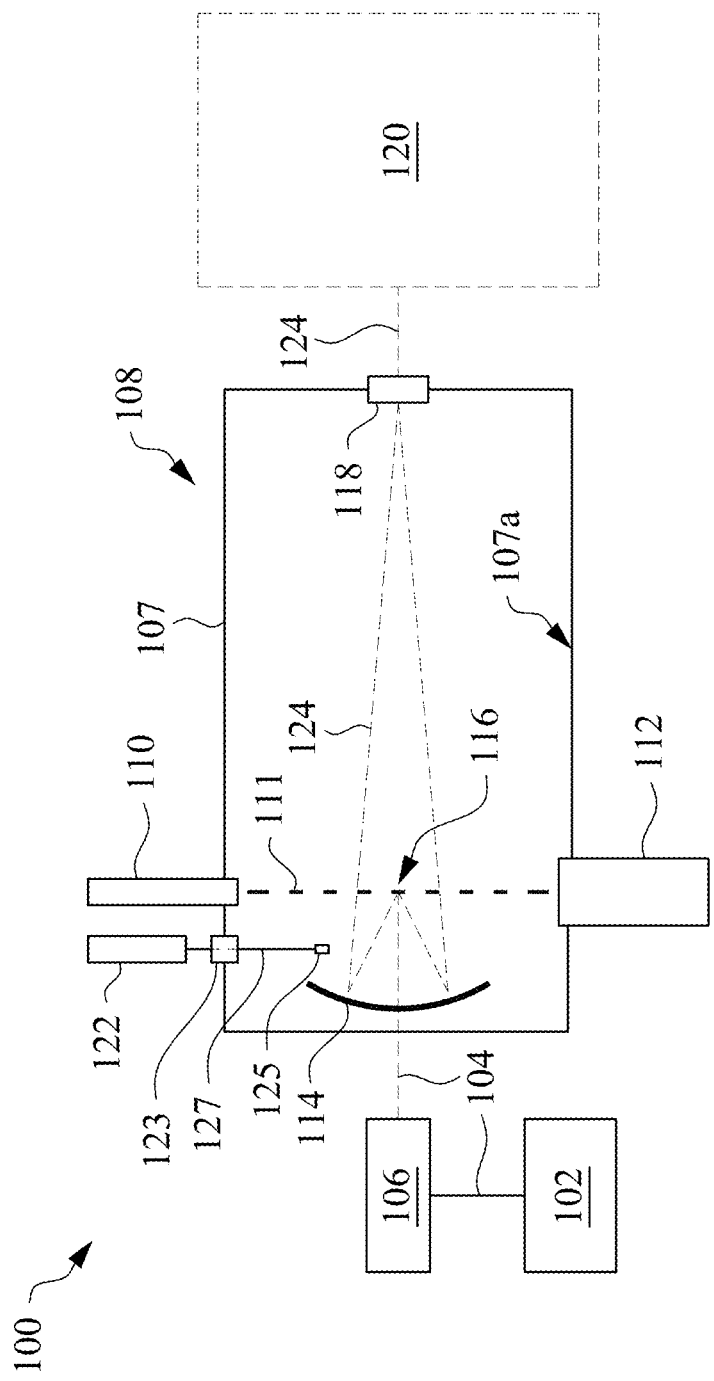
FIG. 1 is a schematic view of an EUV radiation source in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view of an EUV radiation source 100 in accordance with some embodiments. The EUV radiation source 100 generally includes an EUV light source 102, a beam transport and focusing system 106, and an EUV chamber 108. In some embodiments, the EUV light source 102 may include a laser production plasma (LPP) based EUV light source. The EUV light source 102 can be a pulsed laser source (e.g., a $CO_2$ laser) that generates and amplifies a laser beam 104. The laser beam 104 is directed by the beam transport and focusing system 106 to the EUV chamber 108.

The EUV chamber 108 includes a droplet generator 110 and a droplet catcher 112. The droplet generator 110 provides droplets 111 of, for example, tin (Sn), lithium (Li), or an alloy or compound of Sn and Li, into the EUV chamber 108. The EUV chamber 108 includes one or more optical components such as a collector 114. In some embodiments, the collector 114 may include a normal incidence reflector implemented as a multilayer mirror. The collector 114 includes an aperture through which the laser beam 104 may pass through and irradiate droplets generated by the droplet generator 110, thereby producing a plasma in an irradiation region 116. In some embodiments, the collector 114 may have a first focus in the irradiation region 116 and a second focus in an intermediate focus region 118. In one exemplary embodiment, the plasma generated in the irradiation region 116 produces EUV light 124, such as EUV light having a wavelength ranging between about 1 nm and about 100 nm. The EUV light 124 is collected by the collector 114 and reflected to the intermediate focus region 118 by the multi-layer mirror of the collector 114. The EUV light 124 is transmitted from the EUV chamber 108 through the intermediate focus region 118 and into an EUV lithography system 120 for processing of a semiconductor substrate (not shown).

The EUV chamber 108 also has a vacuum port 123 at a side of the chamber body 107 of the EUV chamber 108 for receiving a device, such as a metrology apparatus 122. Over time, the collector 114, optics/components or interior surfaces 107a of the EUV chamber 108 may become contaminated by material from the droplet generator 110. To maintain optimal performance and extend the lifetime of the EUV chamber 108, it is beneficial to periodically inspect and perform preventive maintenance (PM) on the EUV chamber 108. Routine inspection of the EUV chamber 108 may be done by the metrology apparatus 122, which uses a tool 125, such as a camera, to capture images of the collector 114 and/or interior surfaces 107a of the EUV chamber 108. In some embodiments, the tool 125 is attached to an end of a retractable rod 127 and inserted into the EUV chamber 108 through the vacuum port 123.

Figure 2A:
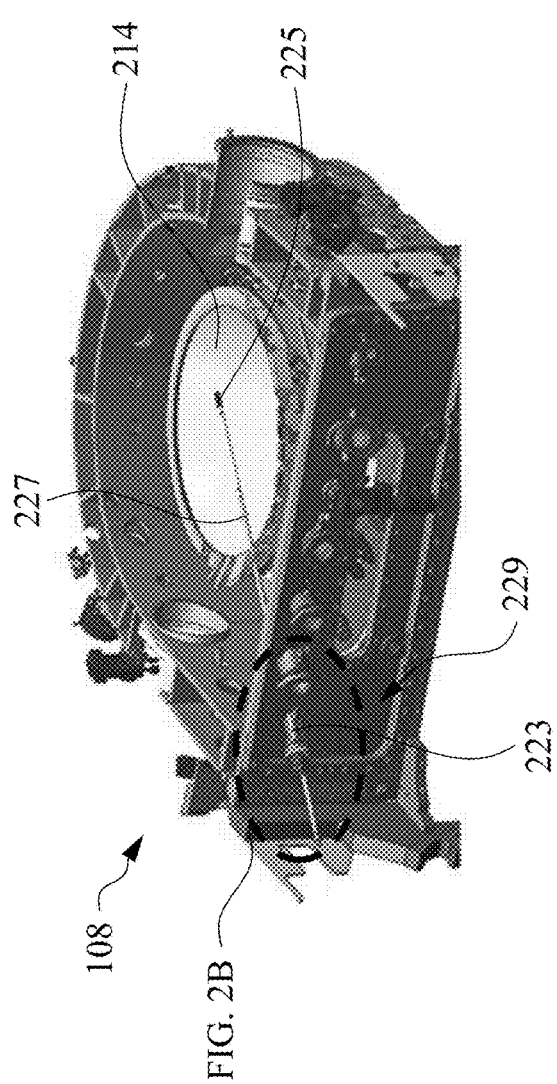
FIG. 2A is a perspective view of a portion of an EUV chamber in accordance with some embodiments.

FIG. 2A is a perspective view of a portion of the EUV chamber 108 in accordance with some embodiments. A vacuum port 223, such as the vacuum port 123, is disposed at a side 229 of the EUV chamber 108. A retractable rod 227, such as the retractable rod 127, and a tool 225, such as the tool 125, are inserted into the EUV chamber 108 through the vacuum port 223. The tool 225 may extend to a region at or near a collector 214, such as the collector 114, to capture images of an entirety of the interior of the EUV chamber 108. The tool 225 may be any suitable device depending on the operation needed in the EUV chamber 108. In some embodiments, the tool 225 may be implemented as part of a borescope or a camera. In some embodiments, the tool 225 may be implemented as a measuring tool, such as a vacuum gauge or a pressure gauge. In some embodiments, the tool 225 may be implemented as a venting or vacuum-evacuation tool. In some embodiments, the tool 225 may be implemented as a cleaning tool.

Figure 2B:
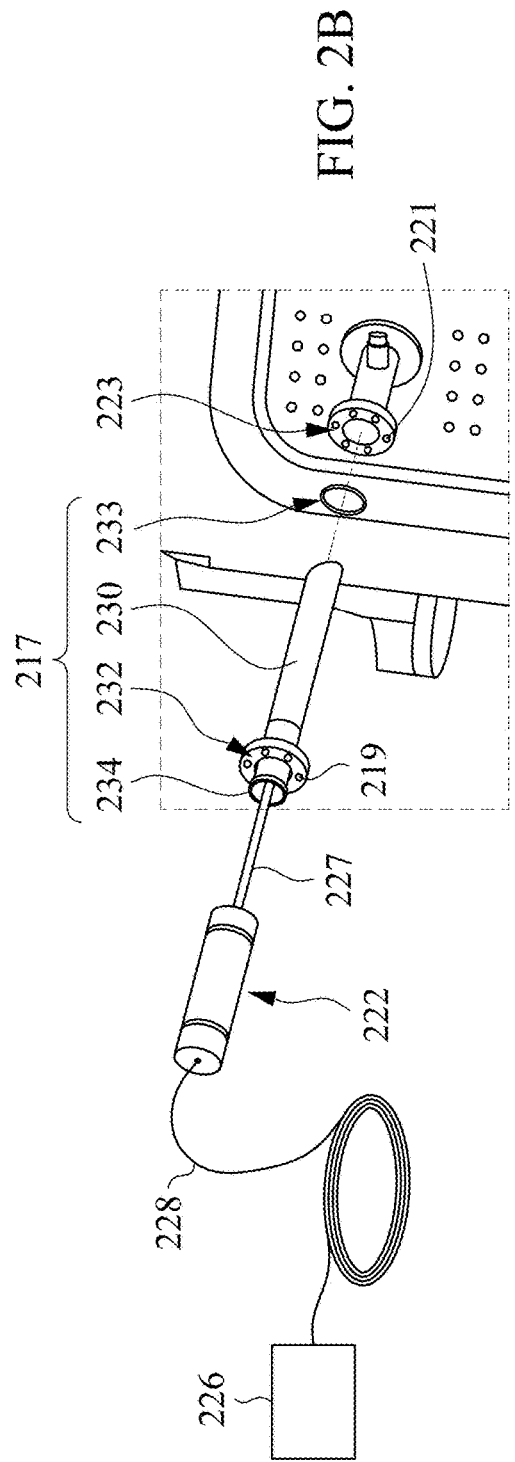
FIG. 2B is an enlarged view of a vacuum port of FIG. 2A in accordance with some embodiments.

FIG. 2B is an enlarged view of the vacuum port 223 of FIG. 2A in accordance with some embodiments. FIG. 2B shows a state of the vacuum port 223 prior to assembling with a vacuum interface kit 217 and a device 222, such as a metrology apparatus 122. The device 222 has one end attached to a wire 228 which is in electrical communication with a system 226, such as a metrology system. The other end of the device 222 is attached to the retractable rod 227. The vacuum interface kit 217 generally includes an O-ring 233, a vacuum tube 230 attached to a vacuum adapter 232, and a vacuum interface 234. The vacuum port 223 is configured to receive the vacuum tube 230, which is coupled to the vacuum adapter 232. The O-ring 233 is sized to allow passage of the vacuum tube 230. The O-ring 233 is in contact with the vacuum port 223 and the vacuum adapter 232 upon assembly to ensure a vacuum seal between the vacuum port 223 and the vacuum adapter 232. Each of the vacuum adapter 232 and the vacuum port 223 may have threaded holes 219, 221, respectively. The vacuum adapter 232 and the vacuum port 223 are fastened together by using fastening devices such as bolts or any suitable means.

Figure 3:
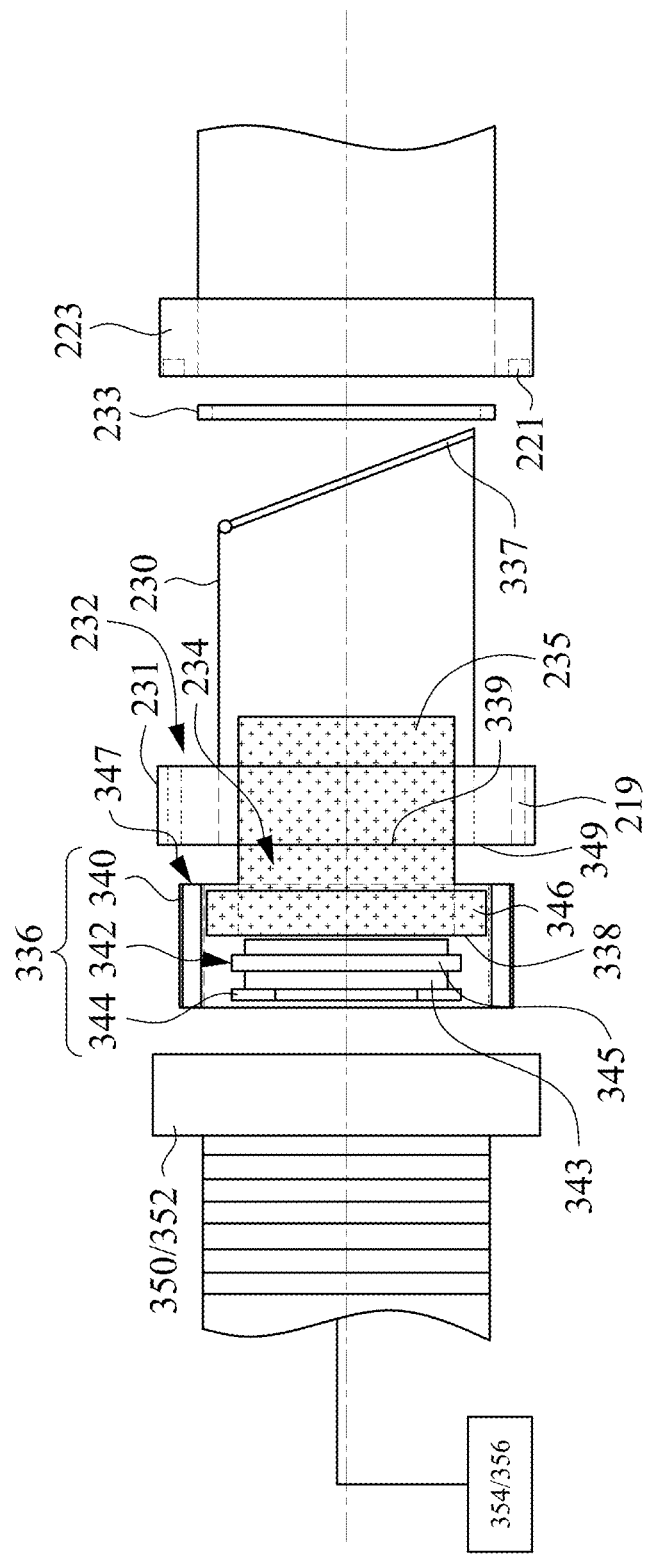
FIG. 3 is a cross-sectional view of a protection unit to be engaged with a vacuum interface in accordance with some embodiments.

As can be seen in FIGS. 2B and 3, the vacuum interface 234 generally includes a tubular body 235 and a flange 346 attached to an end of the tubular body 235. The flange 346 extends radially from a periphery of the tubular body 235.

The vacuum interface 234 is configured to receive and guide a portion of the device 222 (e.g., the retractable rod 227) to the vacuum adapter 232. The vacuum adapter 232 may have a flange 231 extending radially from a first end of the vacuum tube 230. The second end of the vacuum tube 230 may be tapered to facilitate insertion of the vacuum tube 230 into the vacuum port 223. A hinged door 337 may be disposed at the second end of the vacuum tube 230. The hinged door 337 remains closed on the vacuum tube 230 and can be pushed open (FIG. 5) by, for example, the retractable rod 227 of the device 222. The flange 231 of the vacuum adapter 232 has an opening 339 leading to the vacuum tube 230. The opening 339 of the vacuum adapter 232 is sized to allow passage of a portion of the vacuum interface 234, such as the tubular body 235. The vacuum adapter 232 is interchangeable with other vacuum adapters having different sizes of the opening to allow various metrology apparatuses to pass through.

During the preventive maintenance, the device 222 may damage the vacuum interface 234 due to improper guiding of the device 222 with the vacuum interface 234 or the device 222 being brought into contact with the vacuum interface 234 with too much force. In such cases, a surface of the vacuum interface 234 (e.g., the surface facing the retractable rod 227) may be scratched or dented by the device 222. When the surface of the vacuum interface 234 is damaged, the seal at or near the vacuum interface 234 is compromised, resulting in air leaking and contamination of the surface of the collector 214 or other optics/components in the EUV chamber. A contaminated surface of the collector 214 may interfere with the EUV light to be reflected from the collector 214. As a result, the overall yield and quality of the EUV process are suffered. Various embodiments of the present disclosure are proposed to protect the surface of the vacuum interface 234, as will be discussed in more detail below with respect to FIGS. 3-5 and 6A-6B.

FIG. 3 is a cross-sectional view of a protection unit 336 to be engaged with the vacuum interface 234 in accordance with some embodiments. The protection unit 336 protects a surface of the vacuum interface 234, such as a surface 338 of the flange 346, when not in use (e.g., the EUV chamber 108 is not under preventive maintenance). The protection unit 336 includes a clamp 340, an O-ring 342, and a cap 344. The clamp 340 may be any suitable fastening device for securing the O-ring 342, the cap 344, and the flange 346 of the vacuum interface 234 in place. The clamp 340 has a side 347 that is in contact and flush with a surface 349 of the vacuum adapter 232 when assembled. The vacuum interface 234 may be removably attached to the vacuum adapter 232 using any suitable approach, such as by mechanical fasteners, magnetic fasteners, friction fasteners, etc. The O-ring 342 is disposed between the vacuum interface 234 and the cap 344. The O-ring 342 may be a ring 343, such as a copper ring, having a rubber 345 disposed around the periphery of the ring 342. The clamp 340 surrounds and covers the flange 346 of the vacuum interface 234, while the cap 344 keeps the surface 338 of the vacuum interface 234 from being exposed when not in use. The vacuum interface 234 with the protection unit 336 are connected with the vacuum adapter 232, which may or may not be connected to the vacuum port 223 during processing of the substrate. Alternatively, the vacuum interface 234 with the protection unit 336 may be connected with the vacuum port 223 when the EUV chamber 108 is not under preventive maintenance.

Figure 4:
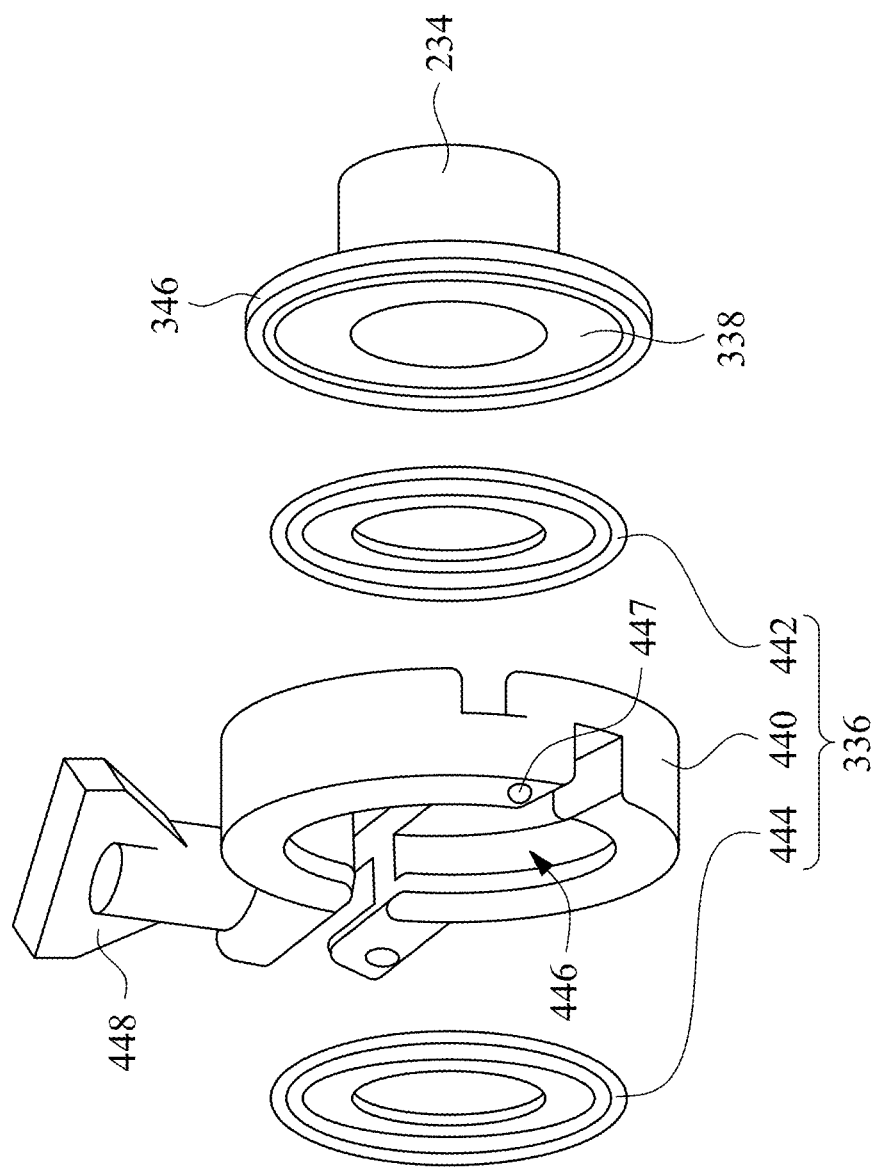
FIG. 4 is a perspective view of an exemplary protection unit that can be used to protect a vacuum interface in accordance with some embodiments.

FIG. 4 is a perspective view of an exemplary protection unit 436 that can be used to protect the vacuum interface 234 in accordance with some embodiments. The protection unit 436 includes a clamp 440, an O-ring 442 (e.g., the O-ring 342), and a cap 444 (e.g., the cap 344). The clamp 440 has an inner recess 446 sized to receive the O-ring 442, the cap 444, and the flange 346 of the vacuum interface 234 when assembled. The clamp 440 has a hinge 447 and a nut 448. The clamp 440 can be fastened or released with rotation of the nut 448, thereby engaging or disengaging with the O-ring 442, the cap 444, and vacuum interface 234. Similar to the protection unit 336, the clamp 440 surrounds and covers the flange 346 of the vacuum interface 234, while the cap 444 keeps the surface 338 of the vacuum interface 234 from being exposed when not in use. The vacuum interface 234 is connected with the vacuum adapter 232, which may or may not be connected to the vacuum port 223 during processing of the substrate. Alternatively, the vacuum interface 234 with the protection unit 436 may be connected with the vacuum port 223 when the EUV chamber 108 is not under preventive maintenance.

Referring back to FIG. 3, in cases where a vacuum condition is desired in an EUV chamber (e.g., the EUV chamber 108), the protection unit 336 and the vacuum interface 234 may be removed, and a vacuum pipe 350 is connected to the vacuum adapter 232 (connected to the vacuum port 223). Alternatively, the vacuum pipe 350 can be connected directly to the vacuum port 223 without the use of the vacuum adapter 232. The vacuum pipe 350 is in fluid communication with a vacuum pump 354 to control or maintain the EUV chamber 108 in a vacuum state. Likewise, in cases where one or more gases are needed in the EUV chamber, the protection unit 336 and the vacuum interface 234 may be removed, and a gas pipe 352, which is in fluid communication with one or more gas sources 356, is connected to the vacuum adapter 232 (connected to the vacuum port 223) to introduce gas(es) into the EUV chamber 108. Alternatively, the gas pipe 352 can be connected directly to the vacuum port 223 without the use of the vacuum adapter 232.

Figure 5:
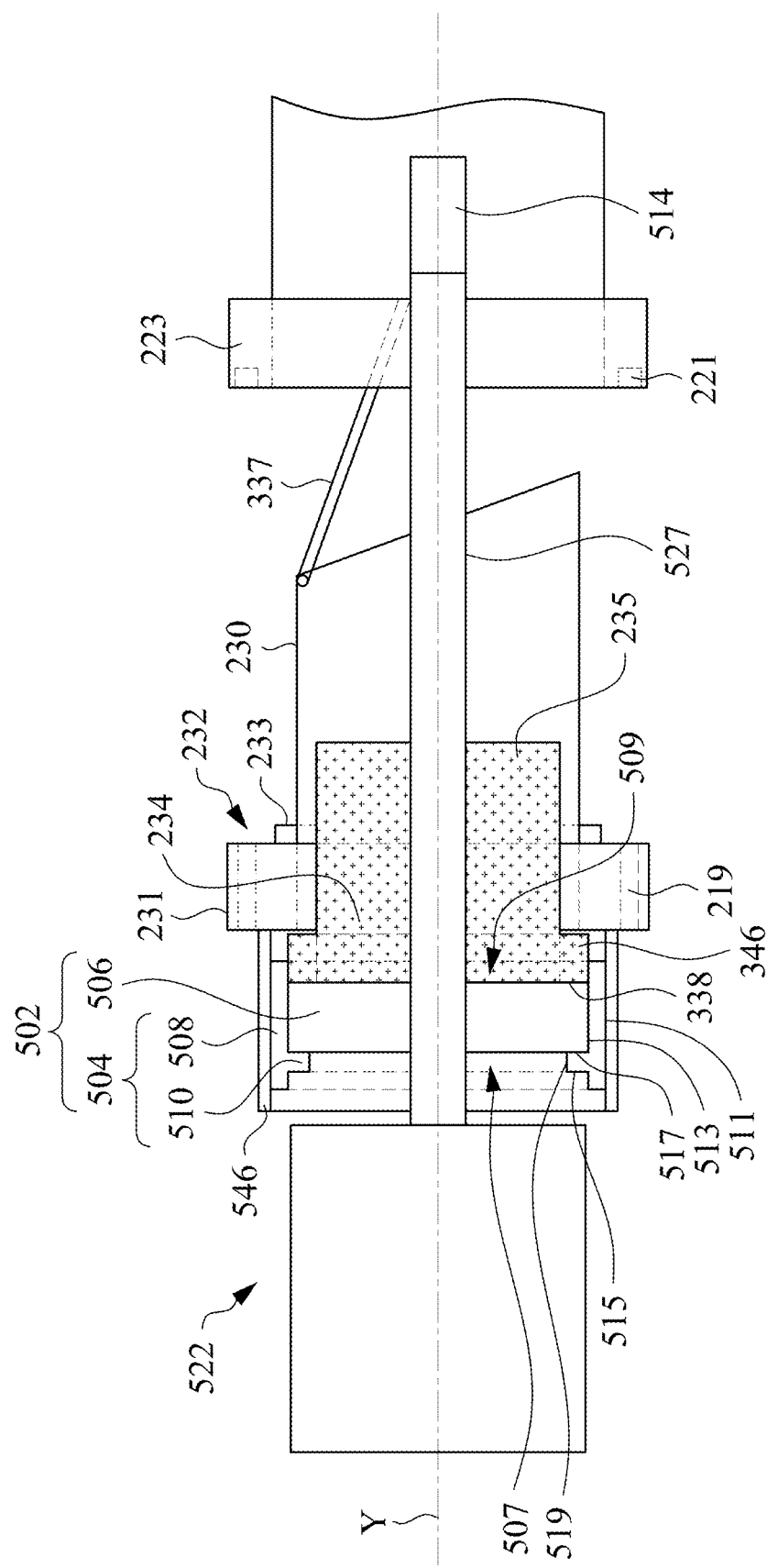
FIG. 5 is a cross-sectional view of a device prior to full insertion into a vacuum port in accordance with some embodiments.

FIG. 5 is a cross-sectional view of a device 522 (e.g., the device 222) prior to full insertion into the vacuum port 223 in accordance with some embodiments. When a preventive maintenance is required on an EUV chamber (e.g., the EUV chamber 108), the clamp (e.g., the clamp 340, 440) is released to remove the cap (e.g., the cap 344, 444) and the O-ring (e.g., the O-ring 342, 442), and the vacuum interface 234 is engaged with the device 522 through a protective ring structure 502. The protective ring structure 502 includes an outer ring 504 and an inner ring 506 nested in the outer ring 504. The inner ring 506 has an adjustable opening to accommodate the profile of a portion of the device 522, such as a tool 514 and a retractable rod 527. The tool 514 can be an inspection tool, a measuring tool, or any tool needed to perform action in the EUV chamber 108. Details of the inner ring 506 are further discussed in FIGS. 6A-6D, 7A-7D, and 8A-8D.

A fastener 546, such as the clamp 340 or 440, may be used to secure the protective ring structure 502 to the vacuum interface 234. The outer ring 504, the inner ring 506, and the tubular body 235 of the vacuum interface 234 are co-centered once attached together and secured by the fastener 546. The use of the protective ring structure 502 ensures that the vacuum interface 234 stays in contact with the inner ring 506 before portions of the device 522 are inserted into the vacuum interface 234. Therefore, the surface 338 of the vacuum interface 234 is protected by the inner ring 506 and not prone to any damages caused by the device 522. The vacuum interface 234 is inserted into the vacuum adapter 232, which is to be connected to the vacuum port 223 (e.g., via threaded holes 219, 221 and bolts). Once the vacuum adapter 232 is connected to the vacuum port 223, the tool 514 and the retractable rod 527 of the device 522 are advanced along the axis Y to push the hinged door 337 open and enter the vacuum port 223.

The outer ring 504 is generally a tubular structure having a first portion 508 and a second portion 510 protruded from the first portion 508. The first portion 508 is greater in length than the second portion 510. The first portion 508 has a first side 511 in contact with the fastener 546 and a second side 513 opposing the first side 511. The second portion 510 is protruded from the second side 513 of the first portion 508 and form an angle of about 90 degrees with respect to the first portion 508. The second portion 510 has a first side 515, a second side 517 opposing the first side 515, and a third side 519 parallel to the second side 513 of the first portion 508. As can be seen in FIG. 5, the first side 515 of the second portion 510 and the second side 513 of the first portion 508 are (or to be) in contact with a portion of the device 522. The second side 517 of the second portion 510 and the second side 513 of the first portion 508 are (or to be) in contact with the inner ring 506. In some embodiments, an O-ring (not shown) may be provided to the first side 515 of the second portion 510, or between the outer ring 504 and the device 522. In some embodiments, the first portion 508 of the outer ring 504 is in contact with at least a portion of the vacuum interface 234. In such cases, the second side 513 of the first portion 508 can be in contact with a periphery of the flange 346 of the vacuum interface 234 to help attach the vacuum interface 234 to the protective ring structure 502.

To help connecting the outer ring 504 to the vacuum interface 234, the second side 513 of the first portion 508 may have a first feature (e.g., a bump or the like) to be engaged with a second feature (e.g., a recess or the like) on an exterior surface of the flange 346. Alternatively, a third feature (e.g., a magnet or the like) may be provided in the surface 338 of the flange 346 to help connect with the outer ring 504 and/or the inner ring 506.

Once the fastener 546 secures the protective ring structure 502 to the vacuum interface 234 and the vacuum interface 234 is inserted into the vacuum adapter 232, the inner ring 506 and the flange 346 of the vacuum interface 234 are held between the second portion 510 and the vacuum adapter 232, with the inner ring 506 being placed against the surface 338 of the vacuum interface 234. The device 522, including the retractable rod 527 and the tool 514, is movable and rotatable relative to the protective ring structure 502 and the vacuum interface 234.

The inner diameter of the outer ring 504 may be changed according to the profile of a portion of the device 522 to be passed through the outer ring 504. The size of the outer ring 504 and inner ring 506 can also be changed according to the outer diameter of the vacuum interface 234 and/or the vacuum adapter 232. If desired, the fastener 546 can be adjusted (e.g., by turning the nut 448) or replaced with a fastener having a different size to assist securing the vacuum interface 234 to the protective ring structure 502.

The outer ring 504 may include or be made of a metal material. Suitable materials for the outer ring 504 may include, but are not limited to, aluminum, steel, iron, stainless steel, nickel, nickel plated, titanium, copper, brass, bronze, lead, tin, zinc, bismuth, indium, carbides, nitrides, or alloys thereof. Other material such as ceramics, crystalline solids such as glass, glass-mica, boron nitride, alumina, or silicates, the like, or any combination thereof, may also be used.

The inner ring 506 is a ring assembly that is removably attached to the outer ring 504. The inner ring 506 has a first side 507 and a second side 509 opposing the first side 507. The second side 509 is to be in contact with the surface 338 of the vacuum interface 234. The inner ring 506 is disposed radially inward of the outer ring 504 when attached. The inner ring 506 has an opening that is size adjustable to accommodate the profile of the device 522 or any other device to be passed through the inner ring 506. The inner ring 506 protects the surface 338 of the vacuum interface 234 while preventing air leaking at or around the surface 238. In general, the inner ring 506 uses a mechanism functioning similar to Iris diaphragm used in a camera lens. That is, a diaphragm made of overlapping blades is used in the inner ring 506 to vary the size of the opening.

Figure 6B:
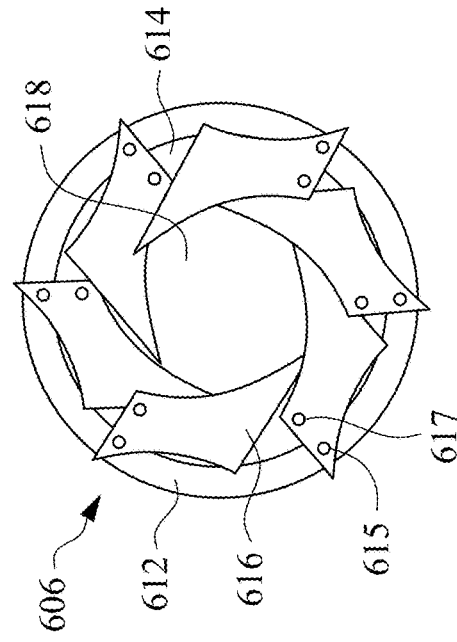
FIGS. 6A and 6B illustrate a front view of an exemplary inner ring being operated in two different states in accordance with some embodiments.
Figure 6D:
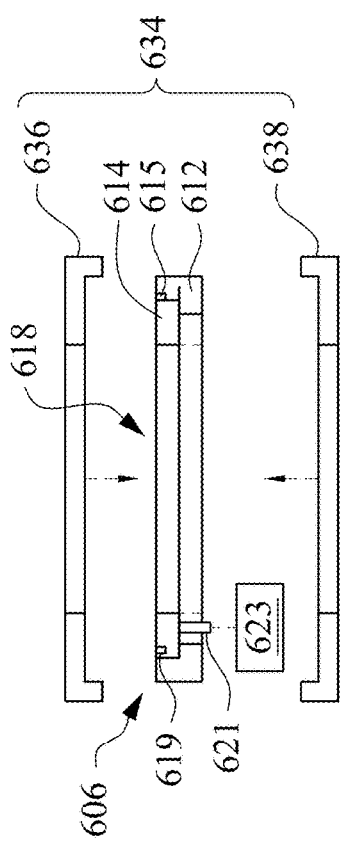
FIG. 6D illustrates a cross-sectional view of an inner ring taken along line A-A of FIG. 6C.
Figure 6A:
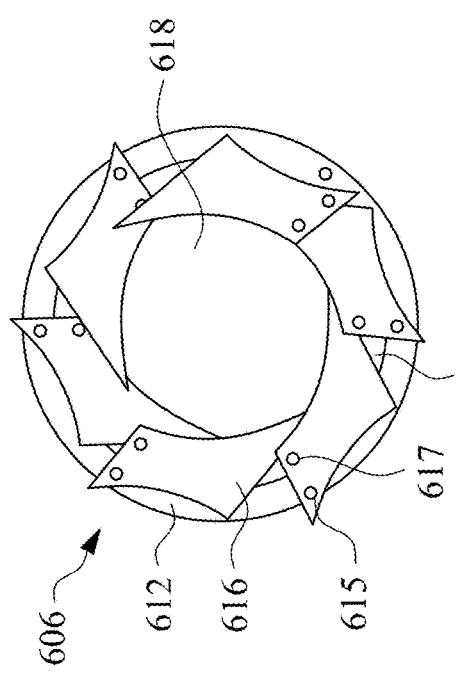
Figure 6C:
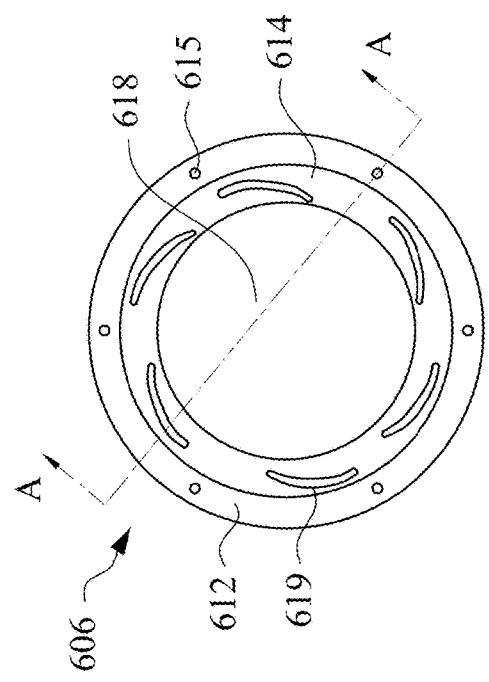
FIG. 6C illustrates portions of an inner ring of FIG. 6A in accordance with some embodiments.

FIGS. 6A and 6B illustrate a front view of an exemplary inner ring 606 being operated in two different states in accordance with some embodiments. FIG. 6C illustrates portions of the inner ring 606 (without blades 616) of FIG. 6A in accordance with some embodiments. FIG. 6D illustrates a cross-sectional view of the inner ring 606 taken along line A-A of FIG. 6C. The inner ring 606 can be used to replace the inner ring 506 and work with the outer ring 504 of FIG. 5 to confirm the movement of the device 522. As can be seen in FIG. 6A, the inner ring 606 generally includes a stationary ring 612, a rotating ring 614 disposed inside the stationary ring 612, and a plurality of overlapping blades 616 arranged over the stationary ring 612 and the rotating ring 614. Each of the plurality of blades 616 may be attached to the stationary ring 612 by a pivot assembly 615, and to the rotating ring 614 by a slider assembly 617. The slider assembly 617 slides along a slot 619 formed in the rotating ring 614. The slots 619 may be arranged at an angle with respect to each other and spaced equally around the rotating ring 614, as shown in FIG. 6C. The stationary ring 612 and the rotating ring 614 are co-centered and are kept in sliding contact.

Each of the plurality of blades 616 has a curved shape that defines a boundary of an opening 618 at the center of the inner ring 606. The blades 616 may have a sickle-like shape, a half-moon like shape, or any other shape such as those shown in FIGS. 7B-7D. The opening 618 is adjustable between a maximum opening and a minimum opening by rotation of the rotating ring 614 between a maximum opening position and a minimum opening position. The rotation of the rotating ring 614 causes the blades 616 to pivot around the pivot assembly 615, with the slider assembly 617 sliding along the slot 619. By holding the stationary ring 612 stationary, the blades 616 move towards or away from the center of the inner ring 606, thereby changing the size of the opening 618 to fit the profile of the device passing therethrough. A lever 621 or the like may be provided to a side of the rotating ring 614 to allow ease rotation of the rotating ring 614. Additionally or alternatively, the rotation of the rotating ring 614 may be controlled electronically via an actuator 623. The level 621 may face the opposite side of the vacuum interface 234 so that the rotating ring 614 can be rotated after attaching the inner ring 606 to the vacuum interface 234.

Figure 7D:
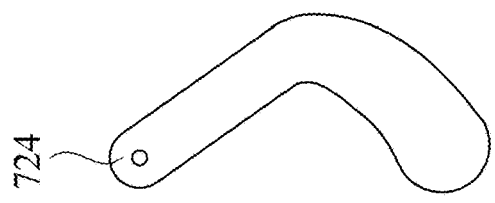
FIGS. 7B, 7C and 7D illustrate some exemplary blades that can be used for an inner ring in accordance with some embodiments.
Figure 7C:
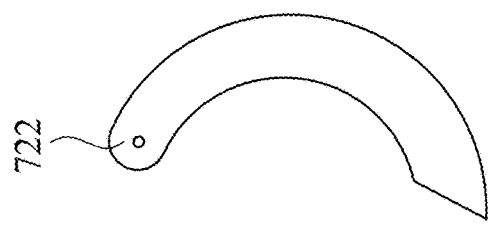
Figure 7B:
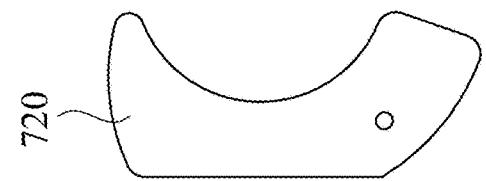
Figure 7A:
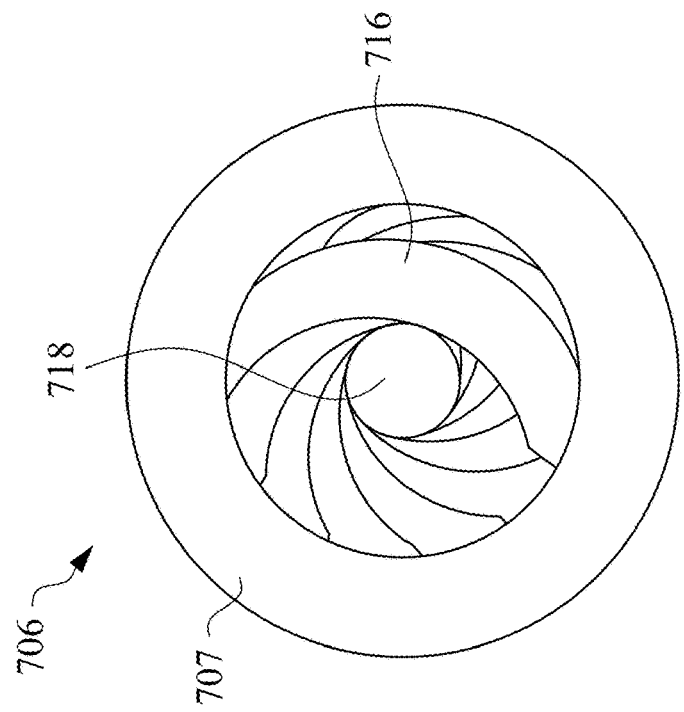
FIG. 7A is a front view of an exemplary inner ring in accordance with some alternative embodiments.

The inner ring 606 may be optionally enclosed in a housing assembly 634, such as the housing assembly 707 in FIG. 7A) that includes an upper housing shell 636 and a lower housing shell 638. Each of the upper housing shell 636 and the lower housing shell 638 has an opening having the same inner diameter as the stationary ring 612 and the rotating ring 614. The housing assembly 634 provides support for the inner ring 606 and keeps the stationary ring 612 and the rotating ring 614 aligned. The pivot assembly 615 may serve as spacers for the housing assembly 634. The lower housing shell 638 may provide mounting to the stationary ring 612. In cases where the housing assembly 634 is used, the housing assembly 634 may be in contact or connected with the outer ring 504. Alternatively, the housing assembly 634 may function as the outer ring 504 without the use of the outer ring 504.

It is contemplated that the inner ring 606 as shown in FIGS. 6A-6D are merely for illustration purposes. The inner ring 606 may be constructed in the form of any suitable mechanism based on Iris diaphragm mechanism or the like to provide an adjustable opening for accommodating a device, such as a metrology apparatus. In addition, while the inner ring 606 is shown to have the rotating ring 614 disposed inside the stationary ring 612, the rotating ring 614 can be disposed around the stationary ring 612. In such a case, the rotating ring 614 can be configured to support and confine the movement of the stationary ring 612.

The inner ring 506, 606 may include or be made of a material relatively softer than the outer ring 504. A softer material ensures proper seal between a portion of the metrology apparatus (e.g., the retractable rod 527) and the inner ring (e.g., blades 616) when applying force onto the inner ring 506, 606, (e.g., when the outer ring 504 and the inner ring 506, 606 (and thus the vacuum interface 234) are fastened together with the fastener 546). In various embodiments, the inner ring 506, 606 may include or be made of a plastic or polymer material. In some examples, the blades 616 are made of plastic or polymer material. In some examples, the blades 616 are made of plastic or polymer material and the stationary ring 612 and the rotating ring 614 are made of the same material as the outer ring 504. Suitable materials for the inner ring 506, 606 may include, but are not limited to, polypropylene (PP), polyurethane (PU), polytetrafluoroethylene (PTFE), polyethylene (PE), poly(vinyl chloride) (PVC), polyvinylidene fluoride (PVDF), acrylonitrile butadiene styrene (ABS), or the like.

Figure 8B:
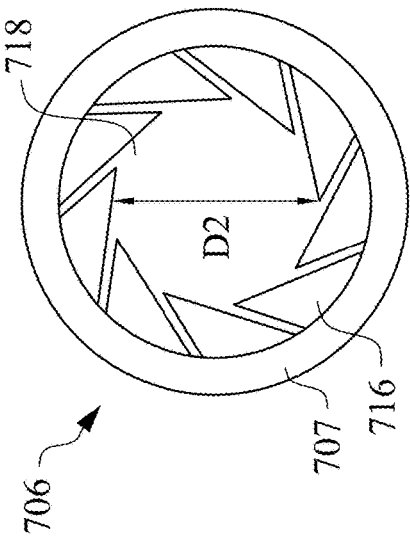
FIGS. 8A-8D illustrate an inner ring being operated to provide an opening with different sizes in accordance with some embodiments.
Figure 8D:
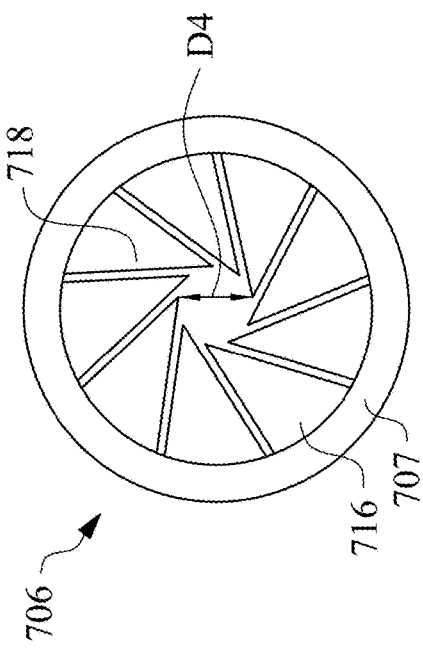
Figure 8A:
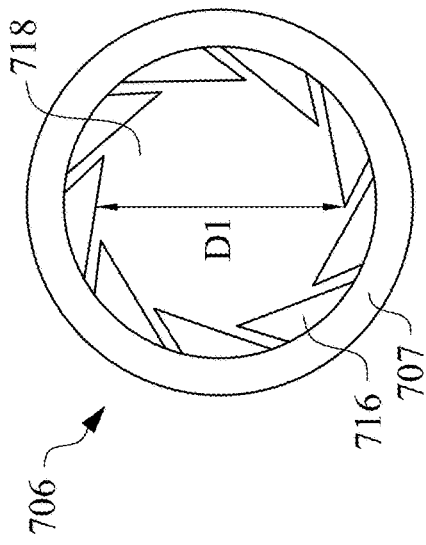
Figure 8C:
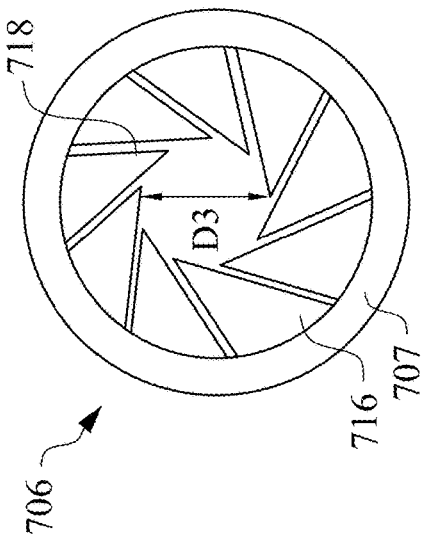

FIG. 7A is a front view of an exemplary inner ring 706 in accordance with some alternative embodiments. FIGS. 7B, 7C and 7D illustrate some exemplary shapes of blades 720, 722, 724 that can be used for the inner rings 506, 606, 706 in accordance with some embodiments. The inner ring 706 adapts a diaphragm mechanism operating similarly to the inner ring 606 and is enclosed by a housing assembly 707. Likewise, the inner ring 706 has a set of overlapping blades 716 forming an opening 718. The size of the opening 718 can be adjusted by turning a rotating ring (not shown, such as the rotating ring 614) with respect to a stationary ring (not shown, such as the stationary ring 612). FIGS. 8A-8D illustrate a front view of the inner ring 706 being operated in different states to vary the size of the opening 718. FIG. 8A shows the inner ring 706 is operated to have the opening 718 with a first diameter D1. FIG. 8B shows the inner ring 706 is operated to have the opening 718 with a second diameter D2 greater than the first diameter D1. FIG. 8C shows the inner ring 706 is operated to have the opening 718 with a third diameter D3 greater than the second diameter D2. FIG. 8D shows the inner ring 706 is operated to have the opening 718 with a fourth diameter D4 greater than the third diameter D3. The diameters D1-D4 are adjusted based on the outer diameter of a metrology apparatus, such as the outer diameter of the retractable rod 527 of the device 522 and/or the outer diameter of the tool 514.

Figure 9:
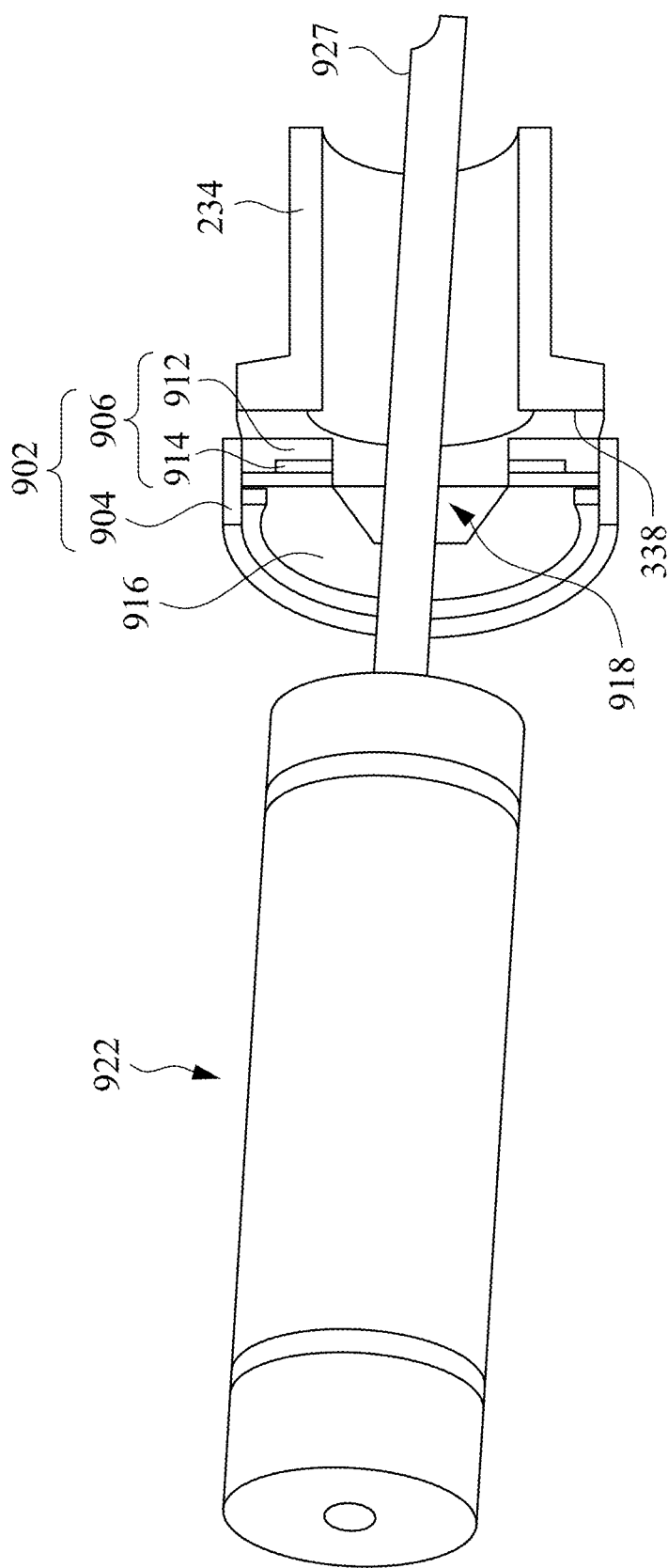
FIG. 9 illustrates a perspective view of a protective ring structure prior to connecting with a device and a vacuum interface in accordance with some embodiments.

FIG. 9 illustrates a perspective view of a protective ring structure 902 prior to connecting with a device 922 (e.g., device 522) and the vacuum interface 234 in accordance with some embodiments. The protective ring structure 902 and the vacuum interface 234 are shown in a cut-out view for ease of illustration. The protective ring structure 902 includes an outer ring 904 (e.g., the outer ring 504) and an inner ring 906 (e.g., the inner ring 606, 706) surrounded by the outer ring 904. The inner ring 906 has a plurality of blades 916 (e.g., blades 616, 716, 720, 722, 724) defining an opening 918 of the inner ring 906. The blades 916 can be operated to close and open upon rotation of a rotating ring 914 with respect to a stationary ring 912, thereby varying the size of the opening 918 to accommodate the profile of a portion of the device 922, such as the outer diameter of a retractable rod 927 to be inserted into the vacuum interface 234.

Figure 10:
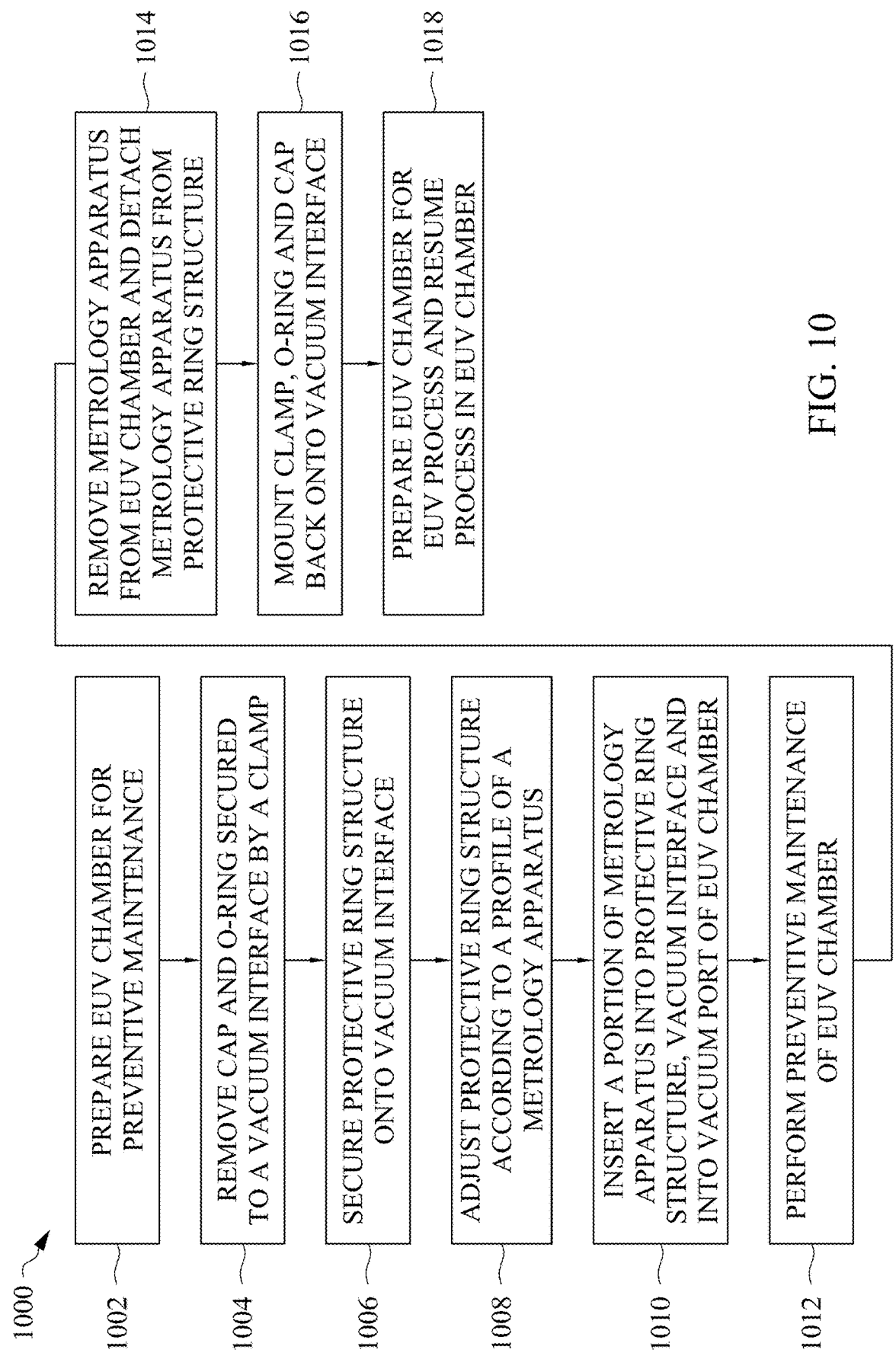
FIG. 10 illustrates a flow chart of a method for performing a preventive maintenance on an EUV chamber using a protective ring structure in accordance with some embodiments.

FIG. 10 illustrates a flow chart of a method 1000 for performing a preventive maintenance on an EUV chamber using a protective ring structure in accordance with some embodiments. It is noted that the operations of the method 1000, including any descriptions given with reference to the figures, are merely exemplary and are not intended to be limiting beyond what is specifically recited in the claims that follow. Additional operations may be implemented before, during, and after the method 1000, and some operations may be replaced or eliminated in accordance with various embodiments of the method 1000.

The method 1000 starts at operation 1002 where an EUV chamber, such as the EUV chamber 108 shown in FIGS. 1 and 2A, is prepared for a preventive maintenance. Exemplary preventive maintenance may include, for example, inspecting contamination of a collector (e.g., collector 114 in FIG. 1) and interior surface (e.g., interior surfaces 107a) in the EUV chamber, de-clogging the EUV chamber, cleaning mirror and/or window of the EUV chamber, conducting measurements in the EUV chamber, etc. Before performing the preventive maintenance on the EUV chamber, various operations in the EUV chamber are terminated to cool down the EUV chamber. A purge gas, such as argon, nitrogen, or helium, is introduced into the EUV chamber to remove residue or unwanted gas (e.g., hydrogen gas) from the EUV chamber. The residue or unwanted gas is then pumped out of the EUV chamber (vacuum break).

At operation 1004, an O-ring (e.g., O-ring 342 in FIG. 3) and a cap (e.g., cap 344 in FIG. 3) are removed or detached from a vacuum interface (e.g., vacuum interface 234 in FIG. 3), which is used to receive and guide a metrology apparatus (e.g., device 522 in FIG. 5) to a vacuum adapter (e.g., vacuum adapter 232 in FIG. 5) or a vacuum port (e.g., vacuum port 223 in FIG. 5) disposed at a side of the EUV chamber. The vacuum interface, the O-ring, and the cap are secured together by a clamp (e.g., clamp 340 in FIG. 3). The O-ring and the cap protect a surface (e.g., surface 338 of the vacuum interface 234) of the vacuum interface from being exposed when not in use. When a device (e.g., metrology apparatus 522) is to be inserted into the vacuum interface, the clamp is released to remove the O-ring and the cap from the vacuum interface.

At operation 1006, a protective ring structure (e.g., protective ring structure 502 in FIG. 5) is mounted onto or brought into contact with the vacuum interface (e.g., vacuum interface 234), and a fastener (e.g., fastener 546 in FIG. 5) is used to secure the vacuum interface to the protective ring structure. An operator may first put an inner ring (e.g., inner ring 506, 606, 706 in FIGS. 5-8D) and an outer ring (e.g., outer ring 504 in FIG. 5) together and attach the protective ring structure to the vacuum interface. The operator may then use the fastener to secure the vacuum interface to the protective ring structure, such as an operation state shown in FIG. 5.

At operation 1008, once the outer ring and the inner ring of the protective ring structure are secured to the vacuum interface by the fastener, the operator may adjust an opening of the inner ring (e.g., inner ring 506, 606, 706 in FIGS. 5-8D) manually or electrically through an actuator. The size of the opening may vary according to a portion of the profile of the metrology apparatus to be fixed by the inner ring. In some cases, the outer ring (e.g., outer ring 504 in FIG. 5) is also adjusted or replaced with a different size of the outer ring in light of the profile of the metrology apparatus to be secured by the protective ring structure. The size of the opening of the inner ring can be adjusted by, for example, turning a rotating ring (e.g., rotating ring 614 in FIG. 6A) with respect to a stationary ring (e.g., stationary ring 612 in FIG. 6A) so that blades (e.g., blades 616 in FIG. 6A) move towards or away from the center of the opening, as the examples shown in FIGS. 8A-8D.

At operation 1010, a portion of the metrology apparatus, such as a retractable rod (e.g., retractable rod 527 in FIG. 5) and a tool (e.g., tool 514 in FIG. 5), is inserted into the protective ring structure (e.g., protective ring structure 502 in FIG. 5). The portion of the metrology apparatus passes through the opening of the inner ring (e.g., inner ring 506, 606, 706 in FIGS. 5-8D) and into the vacuum interface 234 (e.g., vacuum interface 234 in FIG. 5). The metrology apparatus, the protective ring structure, and the vacuum interface are then inserted into the vacuum adapter (e.g., vacuum adapter 232 in FIG. 5), which is to be inserted into and connected with the vacuum port (e.g., vacuum port 223 in FIG. 5) disposed at a side of the EUV chamber. Alternatively, the protective ring structure and the vacuum interface may be first inserted or connected with the vacuum adapter, which is to be inserted or connected with the vacuum port. Once the vacuum adapter (e.g., vacuum adapter 232 in FIG. 5) is connected with the vacuum port (e.g., vacuum port 223 in FIG. 5), the metrology apparatus is inserted to the vacuum port, through the protective ring structure, the vacuum interface, and the vacuum adapter, and into the EUV chamber. In some embodiments, the metrology apparatus, the protective ring structure and the vacuum interface may be inserted directly to the vacuum port without the use of the vacuum adapter. In any case, the surface (e.g., surface 338 in FIG. 5) of the vacuum interface 234 is protected by the inner ring and not exposed directly to the metrology apparatus. Therefore, any damage that may otherwise made to the surface of the vacuum interface 234 by the metrology apparatus is avoided.

At operation 1012, the preventive maintenance is performed on the EUV chamber. The tool of the metrology apparatus, which may be a borescope or a camera, is advanced to a region at or near the collector or any optics/components to perform required process or measurement on the EUV chamber.

At operation 1014, once the preventive maintenance is done, the metrology apparatus is removed from the EUV chamber. The metrology apparatus is then detached from the vacuum interface and the protective ring structure.

At operation 1016, the O-ring (e.g., O-ring 342 in FIG. 3) and the cap (e.g., cap 344 in FIG. 3) is reattached to the vacuum interface (e.g., vacuum interface 234 in FIG. 3), and the clamp (e.g., clamp 340 in FIG. 3) is used to secure the O-ring, the cap, and the vacuum interface together, such as an operation state shown in FIG. 3.

At operation 1018, the EUV chamber is prepared to resume process in the EUV chamber. The preparation of the EUV chamber may include, but is not limited to, restore vacuum condition in the EUV chamber, gas introduction (e.g., hydrogen gas) into the EUV chamber, and increase and maintain desired process temperature in the EUV chamber, etc. Thereafter, an EUV light source (e.g., EUV light source 102 in FIG. 1) is operated to produce a laser beam to be transmitted to a focusing system (e.g., focusing system 106 in FIG. 1) and then to the EUV chamber, as the example shown in FIG. 1.

Figure 11:
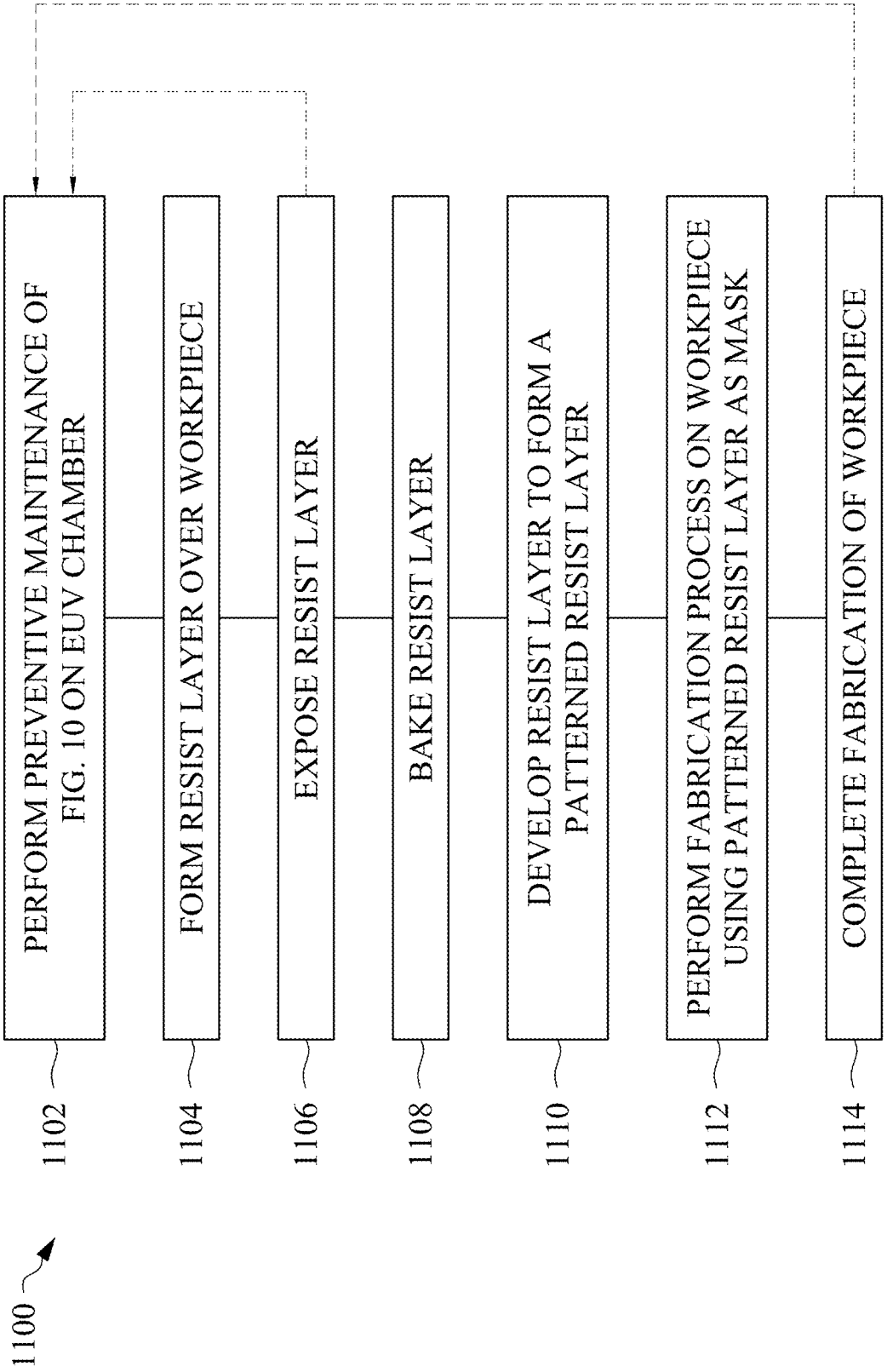
FIG. 11 illustrates a flow chart of a method for fabricating a workpiece in accordance with some embodiments.

FIG. 11 illustrates a flow chart of a method 1100 for fabricating a workpiece in accordance with some embodiments. It is noted that the operations of the method 1100, including any descriptions given with reference to the figures, are merely exemplary and are not intended to be limiting beyond what is specifically recited in the claims that follow. Additional operations may be implemented before, during, and after the method 1100, and some operations may be replaced or eliminated in accordance with various embodiments of the method 1100.

At operation 1102, a preventive maintenance, such as the preventive maintenance of the EUV chamber discussed above with respect to FIG. 10, is performed on an EUV chamber. The preventive maintenance of the EUV chamber may be performed before (e.g., before operation 1104) or after (e.g., after operation 1114) performing a lithography method, or according to a predetermined schedule, to maintain optimal performance and extend the lifetime of the EUV chamber. While the EUV chamber is discussed, it is contemplated that the preventive maintenance may be performed in any chamber using other advanced lithography processes, such as DUV lithography, EUV lithography, e-beam lithography, x-ray lithography, and/or other lithography used to enhance lithography resolution.

At operation 1104, after the preventive maintenance, a lithography method is performed by forming a resist layer over a workpiece in the EUV chamber, The resist layer may be a photoresist layer, a photosensitive layer, an imaging layer, a patterning layer, or any suitable radiation sensitive layer. The workpiece may be at an intermediate stage of fabrication (or processing), and may be a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin-like field effect transistors (FinFETs), nanosheet transistors, other suitable IC components, or combinations thereof.

At operation 1106, the resist layer is exposed to patterned radiation emitted from an energy source, which may emit deep ultraviolet (DUV) light, extreme UV (EUV) light, or electron-beam (e-beam), depending on the type of the system performing the lithography processes. After operation 1106, the substrate is removed from the EUV chamber. The method 1100 may then repeat the preventive maintenance at the operation 1102 in some embodiments.

At operation 1108, the resist layer is baked, for example, by a post exposure baking process in a thermal chamber.

At operation 1110, the resist layer is developed in a developer by immersing the resist layer in a developer (e.g., a chemical solution). The developer selectively removes portions of the resist layer to form a patterned resist layer. The exposure may render the resist layer more soluble in the developer, thereby producing a positive-tone image of the mask. Conversely, the resist layer may become less soluble upon exposure, resulting in generation of a negative-tone image of the mask.

At operation 1112, a fabrication process is performed on the workpiece in a substrate processing chamber using the patterned resist layer as a mask, thereby transferring the pattern from the patterned resist layer into an underlying layer.

At operation 1114, the method 1100 can proceed with completing fabrication of the workpiece. The method 1100 may then repeat the preventive maintenance at the operation 1102 in some embodiments.

Various embodiments of this disclosure provide a protective ring structure for use with a vacuum interface. The vacuum interface is a tubular structure designed to receive and guide a metrology apparatus to an optional vacuum adapter, which is to be connected to a vacuum port disposed at a side of an EUV chamber. The protective ring structure includes an outer ring and an inner ring nested within the outer ring. The inner ring contacts a surface of the vacuum interface, for example the surface of a flange of the vacuum interface facing the metrology apparatus. The vacuum interface and the protective ring structure are secured by a fastener to ensure the surface of the vacuum interface stays in contact with the inner ring. Particularly, the inner ring has an opening that is size adjustable to accommodate the profile of any portion of the metrology apparatus, allowing the metrology apparatus to joint with the vacuum interface. With the protective ring structure, the surface of the vacuum interface is protected and free from any damages (e.g., dents or scratches) which may otherwise cause air leaking and contamination of the optics or components in the EUV chamber. As a result, the overall yield and quality of the EUV process are improved.

An embodiment is an assembly for use with an extreme ultraviolet (EUV) chamber. The assembly includes a ring structure. The ring structure includes an outer ring and an inner ring disposed radially inward of the outer ring. The assembly also includes a vacuum interface to be attached and in contact with the inner ring, wherein the inner ring has an opening that is size adjustable to allow a device to pass through and into the vacuum interface.

Another embodiment is an extreme ultraviolet (EUV) chamber. The EUV chamber includes a chamber body, a vacuum port disposed at a side of the chamber body, a vacuum interface to be provided to the vacuum port, and a ring structure to be attached to the vacuum interface. The ring structure includes an inner ring comprising a plurality of overlapping blades, wherein the plurality of overlapping blades is operated to move towards or away from a center of the inner ring to vary a size of an opening of the inner ring. The ring structure also includes an outer ring disposed around the inner ring, the outer ring having a first portion and a second portion protruding from the first portion, the first portion and the second portion being in contact with the inner ring, wherein the inner ring is in contact with a portion of the vacuum interface.

A further embodiment is a method for connecting a device to a vacuum interface. The method includes providing a ring structure comprising an inner ring and an outer ring disposed around the inner ring, the inner ring comprising a plurality of overlapping blades defining a boundary of an opening of the inner ring. The method also includes securing the ring structure to a portion of the vacuum interface so that the portion of the vacuum interface is in contact with the inner ring. The method also includes providing the vacuum interface to a vacuum port disposed at a side of an extreme ultraviolet (EUV) chamber. The method also includes inserting a device through the ring structure, the vacuum interface, and into the vacuum port to perform a preventive maintenance in the EUV chamber. The method further includes operating the plurality of overlapping blades to move towards or away from a center of the inner ring to vary a size of the opening in accordance with a profile of the device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An extreme ultraviolet (EUV) chamber, comprising:
a chamber body;
a vacuum port disposed at a side of the chamber body;
a vacuum interface to be provided to the vacuum port; and
a ring structure to be attached to the vacuum interface, the ring structure comprising:
an inner ring comprising a plurality of overlapping blades, the plurality of overlapping blades being operated to move towards or away from a center of the inner ring to vary a size of an opening of the inner ring; and
an outer ring disposed around the inner ring, the outer ring having a first portion and a second portion protruding from the first portion, the first portion and the second portion being in contact with the inner ring, wherein the inner ring is in contact with a portion of the vacuum interface.

2. The EUV chamber of claim 1, further comprising:
a vacuum adapter configured to connect with the vacuum interface and the vacuum port.

3. The EUV chamber of claim 1, wherein the inner ring comprises:
a stationary ring attached to each of the plurality of overlapping blades by a pivot assembly; and
a rotating ring attached to each of the plurality of overlapping blades by a slider assembly,
wherein the rotating ring is co-centered with the stationary ring, and the stationary ring and the rotating ring are kept in sliding contact.

4. The EUV chamber of claim 3, wherein a portion of the outer ring is in contact with the portion of the vacuum interface.

5. The EUV chamber of claim 4, further comprising:
a fastener operable to secure the inner ring, the outer ring, and the portion of the vacuum interface together.

6. The EUV chamber of claim 1, wherein the vacuum interface comprises:
a tubular body having a first end and a second end opposing the first end; and
a flange extending radially from the first end of the tubular body, wherein the tubular body and the inner ring are co-centered.

7. The EUV chamber of claim 1, wherein the outer ring is made of a metal material and the inner ring is made of a plastic or polymer material.

8. The EUV chamber of claim 1, wherein the vacuum interface and the opening of the inner ring allow a device to pass through and into the vacuum port.

9. The EUV chamber of claim 8, wherein the device is a metrology apparatus.

10. A method for connecting a device to a vacuum interface, comprising:
providing a ring structure comprising an inner ring and an outer ring disposed around the inner ring, the inner ring comprising a plurality of overlapping blades defining a boundary of an opening of the inner ring;
securing the ring structure to a portion of the vacuum interface so that the portion of the vacuum interface is in contact with the inner ring;
providing the vacuum interface to a vacuum port disposed at a side of an extreme ultraviolet (EUV) chamber;
inserting the device through the ring structure, the vacuum interface, and into the vacuum port to perform a preventive maintenance in the EUV chamber; and
operating the plurality of overlapping blades to move towards or away from a center of the inner ring to vary a size of the opening in accordance with a profile of the device.

11. The method of claim 10, further comprising:
prior to providing the vacuum interface to a vacuum port, inserting the vacuum interface to a vacuum adapter; and
connecting the vacuum adapter to the vacuum port.

12. The method of claim 10, further comprising:
prior to securing the ring structure to a portion of the vacuum interface, releasing a fastener to remove an O-ring and a cap from being attached to the portion of the vacuum interface.

13. The method of claim 12, further comprising:
after performing the preventive maintenance, removing the device from the vacuum port;
detaching the ring structure from the vacuum interface; and
securing the O-ring and the cap to the portion of the vacuum interface by the fastener.

* * * * *